United States Patent
Leonard et al.

(10) Patent No.: US 7,103,832 B2
(45) Date of Patent: Sep. 5, 2006

(54) SCALABLE CYCLIC REDUNDANCY CHECK CIRCUIT

(75) Inventors: Todd E. Leonard, Williston, VT (US); Gregory J. Mann, Winfield, IL (US)

(73) Assignee: International Business Machines Corporation, Armonk, NY (US)

( * ) Notice: Subject to any disclaimer, the term of this patent is extended or adjusted under 35 U.S.C. 154(b) by 517 days.

(21) Appl. No.: 10/729,277

(22) Filed: Dec. 4, 2003

(65) Prior Publication Data

US 2005/0138523 A1    Jun. 23, 2005

(51) Int. Cl.
H03M 13/05    (2006.01)

(52) U.S. Cl. ..................................... 714/807
(58) Field of Classification Search ................ 714/807
See application file for complete search history.

(56) References Cited

U.S. PATENT DOCUMENTS

| | | | | |
|---|---|---|---|---|
| 3,678,469 | A * | 7/1972 | Freeman et al. ............ | 714/779 |
| 3,798,597 | A * | 3/1974 | Frambs et al. .............. | 714/781 |
| 3,825,894 | A | 7/1974 | Johnson, Jr. | |
| 4,163,211 | A | 7/1979 | Miura | |
| 4,454,600 | A * | 6/1984 | LeGresley .................. | 714/757 |
| 4,593,393 | A * | 6/1986 | Mead et al. ................ | 714/757 |
| 5,103,451 | A * | 4/1992 | Fossey ....................... | 714/757 |
| 5,130,991 | A * | 7/1992 | Takano ....................... | 714/757 |
| 5,267,249 | A * | 11/1993 | Dong ......................... | 714/775 |
| 5,500,863 | A * | 3/1996 | Kudoh ....................... | 714/776 |
| 5,539,754 | A | 7/1996 | Zuras, Jr. et al. | |
| 5,539,756 | A * | 7/1996 | Glaise et al. ............... | 714/776 |
| 5,614,841 | A | 3/1997 | Marbot et al. | |
| 5,619,516 | A * | 4/1997 | Li et al. ..................... | 714/807 |
| 5,671,238 | A * | 9/1997 | Chen et al. ................. | 714/757 |
| 5,771,249 | A * | 6/1998 | Yanagisawa ................ | 714/798 |
| 5,844,923 | A * | 12/1998 | Condon ...................... | 714/798 |
| 5,878,057 | A * | 3/1999 | Maa ........................... | 714/757 |
| 6,066,965 | A | 5/2000 | Blomgren et al. | |
| 6,076,098 | A | 6/2000 | Nguyen | |
| 6,189,124 | B1 * | 2/2001 | Glaise ........................ | 714/758 |

(Continued)

FOREIGN PATENT DOCUMENTS

EP    0310220 A2    4/1989

OTHER PUBLICATIONS

IBM Technical Disclosure Bulletin, Nielson et al., Byte-Wide ECC/CRC Code and Syndrome Calculator, vol. 29, No. 5, Oct. 1986, pp. 2141-2145.

*Primary Examiner*—Stephen M. Baker
(74) *Attorney, Agent, or Firm*—Schmeiser, Olsen & Watts; William H. Steinberg (57) ABSTRACT

A CRC circuit, CRC method, and method of designing a CRC circuit, the CRC circuit, including: a packet data slice latch having outputs; a multiple level XOR subtree, each level including one or more XOR subtrees, each output of the packet data slice latch coupled to an input of the multiple level XOR subtree, each lower level XOR subtree coupled to a higher level XOR subtree through an intervening latch level; a remainder XOR subtree; a combinational XOR subtree, the outputs of the remainder XOR subtree and the outputs of the multiple level XOR subtree coupled to the inputs of the combinational XOR subtree; and a current CRC result latch, the output of the combinational XOR subtree coupled to the inputs of the current CRC result latch and the outputs of the M-bit current CRC result latch coupled to the inputs of the remainder XOR subtree.

20 Claims, 4 Drawing Sheets

U.S. PATENT DOCUMENTS

| | | | |
|---|---|---|---|
| 6,195,780 B1 * | 2/2001 | Dravida et al. | 714/758 |
| 6,252,425 B1 | 6/2001 | Blomgren et al. | |
| 6,370,667 B1 * | 4/2002 | Maki | 714/758 |
| 6,427,219 B1 * | 7/2002 | Yang | 714/758 |
| 6,519,738 B1 * | 2/2003 | Derby | 714/781 |
| 6,530,057 B1 * | 3/2003 | Kimmitt | 714/758 |
| 6,609,225 B1 | 8/2003 | Ng | |
| 6,701,479 B1 * | 3/2004 | Keller | 714/757 |
| 6,725,415 B1 * | 4/2004 | Ishiwaki | 714/781 |
| 6,820,232 B1 * | 11/2004 | Kim et al. | 714/781 |
| 6,928,608 B1 * | 8/2005 | Peyser et al. | 714/807 |
| 6,934,902 B1 * | 8/2005 | Hara et al. | 714/757 |
| 7,024,615 B1 * | 4/2006 | Kotaka | 714/781 |

\* cited by examiner

SCALABLE CYCLIC REDUNDANCY CHECK CIRCUIT

FIELD OF THE INVENTION

The present invention relates to the field of cyclic redundancy check circuits; more specifically, it relates to a scalable cyclic redundancy check circuit.

BACKGROUND OF THE INVENTION

Error checking of data transmissions between sending and receiving devices use a cyclic redundancy check circuit (CRC) implementing various CRC codes in both the sending and receiving devices. The CRC code is calculated by an exclusive OR (XOR) subtree. As high speed serial interconnect technologies evolve, many of the standards governing these technologies allow bandwidths well beyond the traditional 96 and 128 bits per cycle bandwidths, yet maintain the same transmission frequency as for the older smaller 96 and 128 bits per cycle bandwidths. As bandwidth increases, the complexity and depth of the XOR subtree must increase as the need to process more bits per clock cycle grows. Traditional CRC designs when applied to large bandwidth data transmissions very quickly develop the interrelated problems of timing closure and physical silicon area required to implement the XOR subtree. Therefore, there is a need for a CRC circuit that can handle large bandwidths without timing closure problems.

SUMMARY OF THE INVENTION

A first aspect of the present invention is a cyclic redundancy check circuit, comprising: a W-bit packet data slice latch having outputs; a multiple level XOR subtree having inputs and outputs, each level comprising one or more XOR subtrees, each output of the packet data slice latch coupled to an input of the multiple level XOR subtree, each lower level XOR subtree of the multiple level XOR subtree coupled to a higher level XOR subtree of the multiple level XOR subtree through an intervening latch level; a remainder XOR subtree having inputs and outputs; a combinational XOR subtree having inputs and outputs, the outputs of the remainder XOR subtree and the outputs of the multiple level XOR subtree coupled to the inputs of the combinational XOR subtree; and an M-bit current CRC result latch having inputs and outputs, the output of the combinational XOR subtree coupled to the inputs of the current CRC result latch and the outputs of the M-bit current CRC result latch coupled to the inputs of the remainder XOR subtree.

A second aspect of the present invention is a method for cyclic redundancy check calculation, comprising: providing a W-bit packet data slice latch having outputs; providing a multiple level XOR subtree having inputs and outputs, each level comprising one or more XOR subtrees, each output of the packet data slice latch coupled to an input of the multiple level XOR subtree, each lower level XOR subtree of the multiple level XOR subtree coupled to a higher level XOR subtree of the multiple level XOR subtree through an intervening latch level; providing a remainder XOR subtree having inputs and outputs; providing a combinational XOR subtree having inputs and outputs, the outputs of the remainder XOR subtree and the outputs of the multiple level XOR subtree coupled to the inputs of the combinational XOR subtree; and providing an M-bit current CRC result latch having inputs and outputs, the output of the combinational XOR subtree coupled to the inputs of the current CRC result latch and the outputs of the M-bit current CRC result lath coupled to the inputs of the remainder XOR subtree.

A third aspect of the present invention is a method of designing an M-bit cyclic redundancy check circuit, the method comprising: partitioning an XOR function of the cyclic redundancy check circuit into a remainder XOR partition and a multiple level packet data slice XOR partition; determining I, the largest number of bits I of a subset of the M-bits of a CRC result required to generate output bits of a remainder partition XOR subtree of the cyclic redundancy check circuit; determining Z, the largest number of inputs to an XOR gate in a design library to be used in the cyclic redundancy check circuit; calculating K, the maximum number of XOR stages comprised of Z-input XOR gates in the remainder XOR subtree; calculating N, the maximum number of inputs to any XOR subtree in any level of a multiple level XOR subtree partition of the cyclic redundancy check circuit; partitioning the multiple level XOR subtree partition into XOR subtrees having no number of inputs that is larger than a number of inputs to the remainder XOR subtree; and inserting a latch between each XOR subtree of a lower level partition of the packet data slice XOR partition and a immediately higher level partition of the packet data slice XOR partition.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The terminology Q by P-way XOR subtree defines an XOR subtree having Q outputs and (P×Q) inputs. The notation Q^P should be read as $Q^P$.

Figure 1:
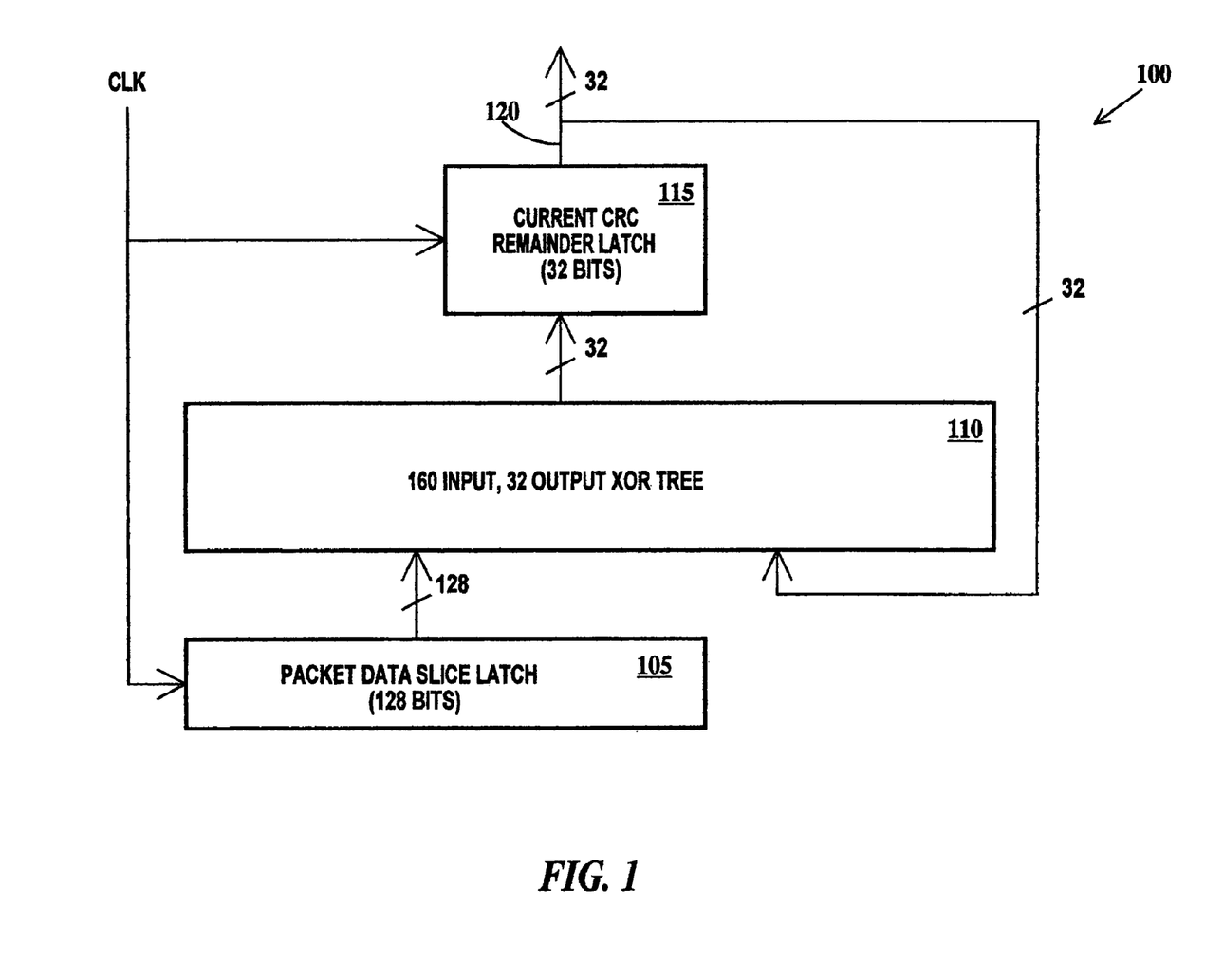
FIG. 1 is an exemplary related art 32-bit CRC circuit.

FIG. 1 is an exemplary related art 32-bit CRC circuit. In FIG. 1, a CRC circuit 100 includes a 128-bit packet data slice latch 105, a single, 160-bit input/32-bit output XOR tree 110 and a 32-bit current CRC remainder latch 115. The bit width of the remainder latch defines the CRC type, in the present example a 32-bit CRC or CRC32. The output of packet slice latch 105 is connected to the input of XOR tree 110 by a 128-bit bus; each bit being connected to a different input. The output of XOR subtree 110 is connected to the input of current CRC remainder latch 115. The output of current CRC remainder latch 115 is a 32-bit CRC output bus 120, which is also connected to the input of XOR tree 110 to provide the cyclic portion of the CRC result. Each output bit of current CRC remainder latch 115 is connected to a different input of XOR tree 110, and to inputs not used by packet data slice latch 105.

Data bits are moved from packet data slice latch 105 through XOR tree 110 and current CRC remainder latch 115 by a clock signal CLK. The same CLK signal moves data bits out of current CRC remainder latch 115 onto CRC output bus and into XOR tree 110. The arrangement of XOR gates in XOR tree 110 implements the CRC code and performs the actual CRC calculation.

As the number of input bits to an XOR tree increases, the depth of XOR gates (the number of XOR gates connected in series from the input to the output of the XOR tree) as well as the number of inputs in each individual XOR gate in the XOR tree increases. At some point, it will take more than a single clock cycle for data bits to travel through the XOR tree and the CRC circuit will generate an erroneous CRC result. The present invention avoids XOR tree data bit propagation time problems by partitioning the XOR tree into XOR-subtrees, which are each small enough not to have a data bit propagation time problem. It should be noted that data bit propagation time is dependent on the integrated circuit technology that the CRC circuit is physically fabricated in.

The present invention partitions the XOR tree into two main partitions. The first partition is a single XOR subtree for processing the remainder of the CRC. The second partition is a multi-level partition, each level comprised of multiple XOR subtrees. Each of these multiple XOR subtrees is no larger than the remainder XOR subtree. Each level of XOR subtrees perform a portion of the CRC calculation and each XOR subtree belonging to a particular level performs a portion of the portion of the CRC calculation performed by the level. The size of the remainder subtree is chosen so that all the XOR calculation it performs can be completed in one clock cycle. Since all the XOR subtrees of the multi-level partition are the size (or smaller) each levels portion of the CRC is likewise performed in one clock cycle or less.

Figure 2:
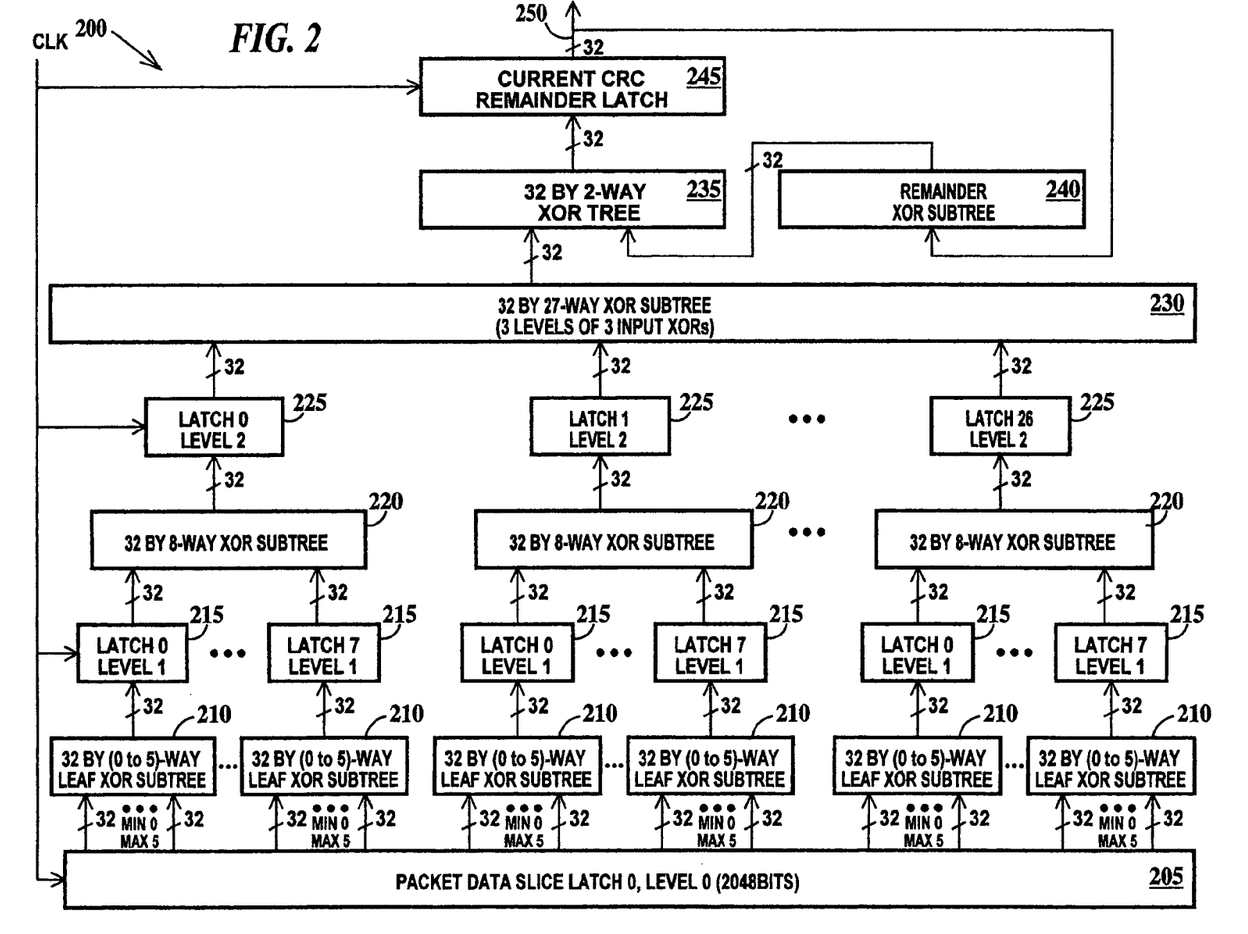
FIG. 2 is an exemplary 32-bit CRC circuit according to the present invention.

FIG. 2 is an exemplary CRC circuit according to the present invention. In FIG. 2, a CRC circuit 200 includes a 2048-bit packet data slice latch 205, 27 sets (in subsets of 8) of 32 by (0 to 5)-way leaf XOR subtrees 210 and corresponding 32-bit latches 215, 27 sets of 32 by 8-way XOR subtrees 220 and corresponding 32-bit latches 225, a 32 by 27-way XOR subtree 230, a 32 by 2-way XOR subtree 235, a remainder XOR subtree 240 and a 32-bit current CRC remainder latch 245. Packet data slice latch 205 is a partition level 0 latch. Latches 215 are partition level 1 latches, and latches 225 are partition level 2 latches, so there are three latch levels in CRC circuit 200. Leaf XOR subtrees 210, XOR subtrees 220 and 230 may be considered to be in a data slice XOR subtree.

Each leaf XOR subtree 210 is connected to packet data slice latch 205 by 0 to 5 32-bit inputs (i. e. 160 inputs to each leaf XOR subtree). Each of the 32 outputs of each leaf XOR subtree 210 is connected to a different input of a corresponding latch 215. There need not be any particular relationship between a particular input of a particular leaf XOR subtree 210 and a particular bit from packet data slice latch 205. Each of the 32 outputs of each latch 215 of each set of 8 latches 215 is connected to a different input of a corresponding XOR subtree 220. Each of the 32 outputs of each latch 225 is connected to a different input of XOR subtree 230. Each of the 32 outputs of XOR subtree 230 is connected to a different input of a 32 member first subset of the 64 inputs of XOR subtree 235. Each of the 32 outputs of XOR subtree 235 is connected to a different input of current CRC remainder latch 245. The 32 outputs of current CRC remainder latch 245 are connected to a 32-bit output bus 250 and to a different input of remainder XOR subtree 240. Each of the 32 outputs of remainder XOR subtree 245 is connected to a different input of a second 32 member of the 64 inputs of XOR subtree 235. The two subsets do not have common inputs.

Data bits are moved from packet data slice latch 205 through leaf XOR subtrees 210 into latches 215 by clock signal CLK. Data bits are moved from latches 215 through XOR subtrees 220 and into latches 225 by clock signal CLK. Data bits are moved from latches 225, through XOR subtrees 230 and 235 into current CRC remainder latch 245 by clock signal CLK Data bits are moved from current remainder latch 245 onto output bus 250 and through remainder XOR subtree 240 and XOR subtree 235 back into current CRC remainder latch 245 by clock signal CLK. The specific arrangement of XOR gates in leaf XOR subtree 210 and XOR subtrees 220, 230, 235 and 240 implements the CRC code and performs the actual CRC calculation.

The structure of CRC circuit 200 is determined by maximum delay through the XOR subtree 240. For example, if XOR subtree 240 is implemented using only 3-input and 2-input XOR gates and the largest CRC remainder expected is 1059-bits then the maximum size of a subset of the 32-bit CRC remainder is 20-bits. The value 1059 is specific to the particular CRC calculation and number of bits processed per CLK cycle. The value 20 is also determined by the particular CRC calculation as are the particular the bits of the 32-bit input to remainder XOR subtree 240 in the subset. The XOR gate structure containing the shortest delay path is realized in a 3 (the smallest whole positive number greater than $\log_3 20$) XOR gate level XOR subtree. The maximum number of inputs of a 3 XOR gate level XOR subtree using 3 input XOR gates is $3^3$ or 27. Thus when partitioning the XOR subtree comprised of leaf XOR subtrees 210 and XOR subtrees 220, 230 and 235, each partition must not be larger than a 27 input XOR operation. The minimum number of latch stages in the XOR subtree comprised of leaf XOR subtrees 210 and XOR subtrees 220, 230 and 235 is 3 (the smallest whole positive number greater than $\log_{27} 1059$). To process 2048-bits of data in one clock cycle, the worst-case single XOR operation must operate on 1059 bits.

A data packet's 32-bit CRC remainder is calculated by initializing CRC 200 to a value of 0xFFFF_FFFF, and then processing the packet through the CRC circuit. Given the current CRC remainder value and a 2048-bit slice of the data packet, the next CRC remainder is calculated and then latched. The next CRC remainder value is calculated by performing a bit wise XOR operation on the two 32-bit outputs of XOR subtree 235 and remainder XOR subtree 240. Each bit of the output of remainder XOR subtree 240 is calculated by performing an XOR operation over a subset of bits of the current CRC remainder value. Each bit of the output of XOR subtree 230 is calculated by performing an XOR operation over a subset of bits of the portion of packet data currently being processed.

While the output of remainder XOR subtree 240 is the result a single XOR operation, the output XOR subtree 230 is the result of several levels or partitions of XOR operations performed respectively by XOR subtree 230, XOR subtrees 220 and leaf XOR subtrees 210. The topmost XOR operation partition (that performed by XOR subtree 230) is picked such that each output is fed by an XOR operation on 27 inputs. The remaining, lower XOR operation partition sizes (those performed by XOR subtrees 220 and by leaf XOR subtrees 210) are picked arbitrarily to balance partition sizes across the bottom two partitions. There are 244 partitions total. (8×27=216 level 0 partitions, 27 level 1 partitions and 1 level 2 partition.) The output of each partition, except for the last partition, is latched. When the last 2048-bits of a data packet are processed, the next CRC remainder is the CRC value for the packet.

Figure 3:
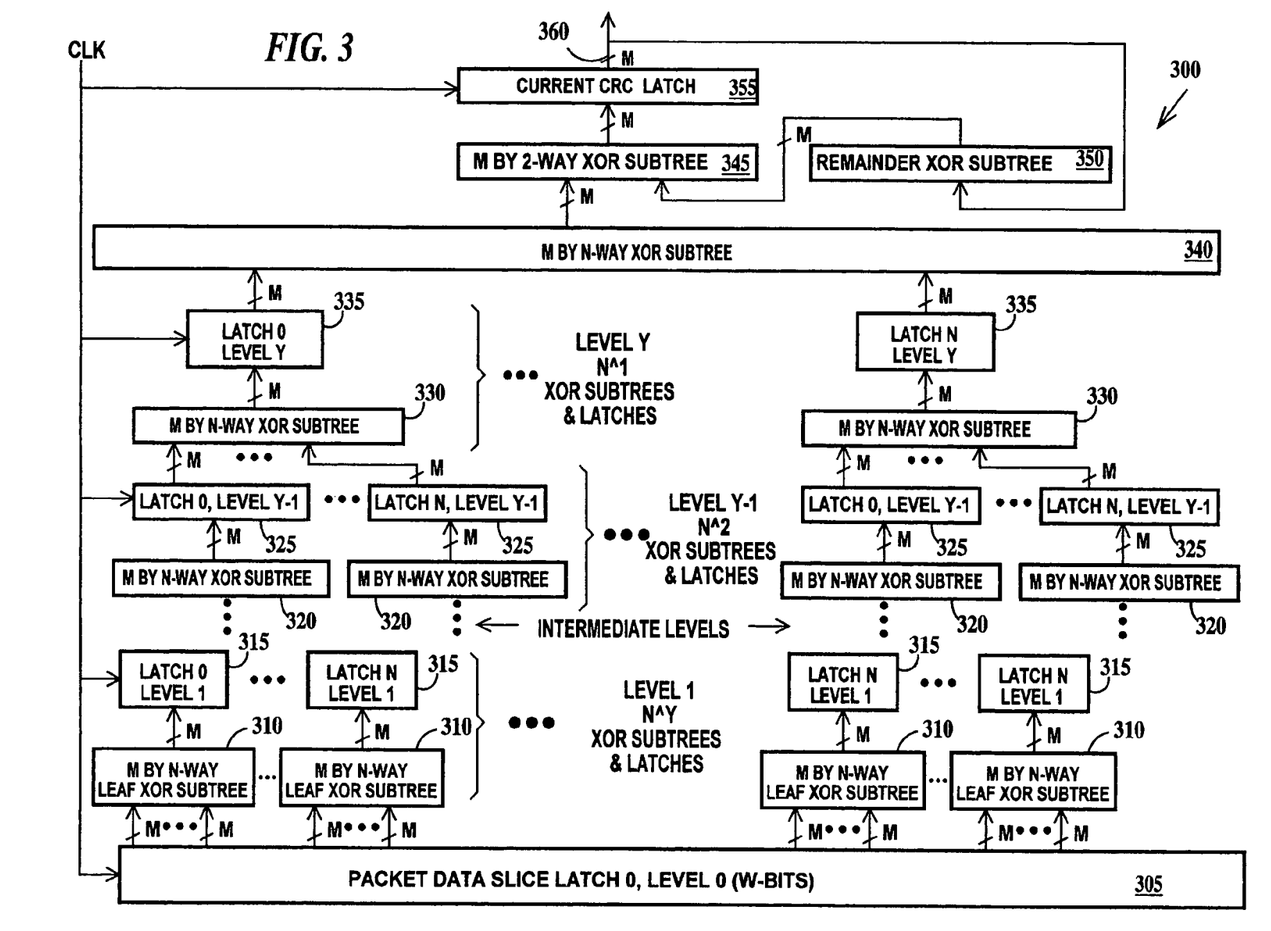
FIG. 3 is a generic scalable M-bit CRC circuit according to the present invention.

FIG. 3 is a generic scalable M-bit CRC circuit according to the present invention. In FIG. 3, a CRC circuit 300 includes a W-bit packet data slice latch 305, $N^Y$ M by N-way leaf XOR subtrees 310 and corresponding M-bit latches 315 (N, Y and M are defined infra), intermediate levels of M by N-way XOR subtrees and corresponding latches (not shown), $N^2$ of M by N-way XOR subtrees 320 and corresponding M-bit latches 325, N M by N-way XOR subtrees 330 and corresponding M-bit latches 335, a M by N way XOR subtree 340, an M by 2 way XOR subtree 345, a remainder XOR subtree 350 and an M-bit current CRC remainder latch 360. Packet data slice latch 305 is a partition level 0 latch. Latches 315 are partition level 1 latches, latches 315 are partition level (Y−1) latches and latches 335 are partition level Y latches, so there are Y+1 partition levels in CRC circuit 300. Leaf XOR subtrees 310, intermediate XOR subtrees (not shown), XOR subtrees 320, 325 and 340 may be considered to be in a data slice XOR subtree.

Each leaf XOR subtree 310 is connected to packet data slice latch 305 by variable numbers of M-bit input. Each of the M outputs of each leaf XOR subtree 310 is connected to a different input of a corresponding latch 315. There need not be any particular relationship between a particular input of a particular leaf XOR subtree 310 and a particular bit from packet data slice latch 305. After progressing through intermediate partition levels, each of the M outputs of each of XOR subtrees 320 is connected to a different input of corresponding latches 325. Each of the M outputs of each latch 325 is connected to a different input of corresponding XOR subtrees 330. Each of the M outputs of XOR subtrees 330 are connected a different input of corresponding latches 335. Each of the M inputs of latches 335 is connected to different inputs of XOR subtree 340. Each of the M outputs of XOR subtree 340 is connected to a different input of a first M member subset of the 2M inputs of XOR subtree 345. Each of the M outputs of XOR subtree 345 is connected to a different input of current CRC remainder latch 355. The M outputs of current CRC remainder latch 355 are connected to an M-bit output bus 360 and to different inputs of remainder XOR subtree 350. Each of the M outputs of remainder XOR subtree 350 is connected to a different input of a second M member subset of the 2M inputs of XOR subtree 345. The two subsets do not have common inputs.

Data bits are moved from packet data slice latch 305 through the (Y−1) partition levels by a clock signal CLK applied to the latches within each partition level. The specific arrangement of XOR gates in the XOR subtrees of the various partition levels of CRC circuit 300 and XOR subtrees 340 and 345 and remainder XOR subtree 350 implements the CRC code and performs the actual CRC calculation.

The structure of CRC circuit 300 is determined by maximum delay through the XOR subtree 350. For example, if XOR subtree 350 is implemented using only Z-input or smaller XOR gates and the largest CRC remainder expected is J-bits then the maximum size of a subset of the M-bit CRC remainder is I-bits. The value I is specific to the particular CRC calculation and number of bits processed per CLK cycle. The value J is determined by the particular CRC calculation as are the particular bits of the M-bit input to remainder XOR subtree 350 in the subset. The XOR gate structure containing the shortest delay path is realized in a K (the smallest whole positive number greater than $\log_Z$ I) XOR gate level XOR subtree. The maximum number of inputs of a K level XOR subtree using Z input XOR gates is $K^Z=N$. Thus when partitioning the XOR subtree comprised of leaf XOR subtrees 310 through XOR subtree 345, each partition must not be larger than a J input XOR operation (which is the size of XOR operation performed by remainder XOR subtree 340). The minimum number of latch stages in the XOR subtree comprised of leaf XOR subtrees 310 through XOR subtree 345 is Y+1 (the smallest whole positive number greater than $\log_N$ J).

A data packet's M-bit CRC remainder is calculated by initializing CRC 300 to a value of −1, and then processing the packet through the CRC circuit. Given the current CRC remainder value and a W-bit slice of the data packet, the next CRC remainder is calculated and then latched. The next CRC remainder value is calculated by performing a bit wise XOR operation on the two M-bit outputs of XOR subtree 345 and remainder XOR subtree 350. Each bit of the output of remainder XOR subtree 350 is calculated by performing an XOR operation over a subset of bits of the current CRC remainder value. Each bit of the output of XOR subtree 340 is calculated by performing an XOR operation over a subset of bits of the portion of packet data currently being processed.

Another way to understand the structure of CRC circuit 300 is that the number of levels of said XOR subtrees in the XOR subtree from leaf XOR subtrees 310 to XOR subtree 340 is a function of A, the maximum number of input bits to all leaf XOR subtrees 310 to give a single output bit of XOR subtree 340 and of B, the maximum number of input bits to remainder XOR subtree 350 to give a single output bit of the remainder XOR subtree. The number of levels of said XOR subtrees in the XOR subtree from leaf XOR subtrees 310 to XOR subtree 340 being $\log_B$ A.

While the output of remainder XOR subtree 350 is the result of a single XOR operation, the output XOR subtree 340 is the result of several levels or partitions of XOR operations performed as illustrated in FIG. 3. The topmost XOR operation partition (that performed by XOR subtree 340) is picked such that each output is fed by an XOR operation on N inputs. The output of each partition, except for the last partition, is latched. When the last W-bits of a data packet are processed, the next CRC remainder is the CRC value for the packet.

Figure 4:
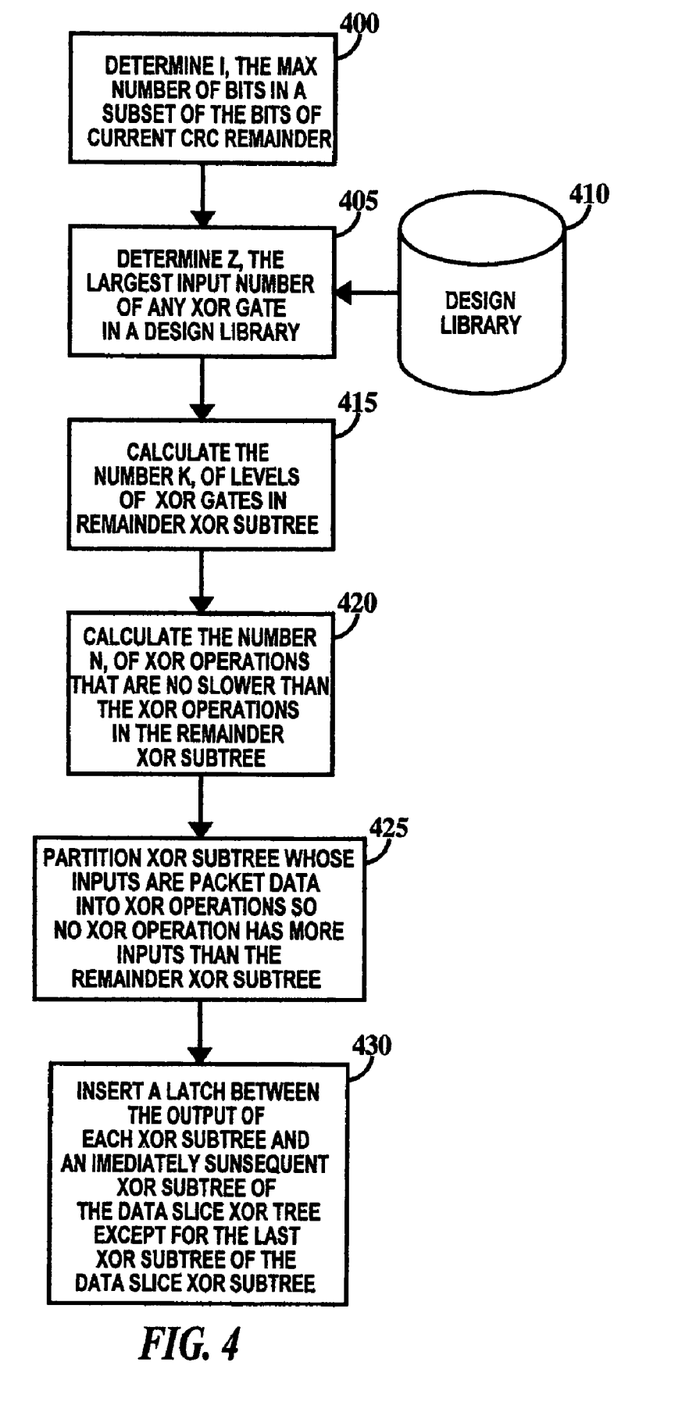
FIG. 4 is a flowchart of the method of designing a scalable CRC circuit according to the present invention.

FIG. 4 is a flowchart of the method of designing a scalable CRC circuit according to the present invention. In step 400 it the largest number of bits in a subset of bits of a CRC remainder to be processed by an XOR operation on that subset of bits by the remainder XOR subtree is determined. This number designated I, and the particular bits of the CRC remainder making up the subset is a function of the CRC function being implemented.

In step 405, from a design library 410 of circuit elements, the XOR gate having the largest number of inputs is determined. Generally this XOR gate is determined by the length of the data path through the XOR gate, its attendant delay, and the amount of integrated circuit real estate it requires. This number of inputs is designated Z.

In step 415, the largest number of XOR gate levels K, in the remainder XOR subtree is calculated using the formula K=smallest whole positive number greater than ($\log_Z$ I).

In step 420, the largest number of XOR operations N, that are no slower than the XOR operations performed by the remainder XOR subtree is calculated using the formula $N=K^Z$.

In step 425, the data slice XOR subtree operating on data packet slices is partitioned into XOR subtrees such that no XOR subtree of the data slice XOR subtree has more inputs then the remainder XOR subtree.

In step 430, the XOR output of every XOR subtree in the data slice XOR subtree are latched except the topmost XOR subtree.

Thus, the present invention provides a scalable CRC circuit that can handle large bandwidths without timing closure problems.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

The invention claimed is:

1. A cyclic redundancy check circuit, comprising:
a W-bit packet data slice latch having outputs;
a multiple level XOR subtree having inputs and outputs, each level comprising one or more XOR subtrees, each output of said packet data slice latch coupled to an input of said multiple level XOR subtree, each lower level XOR subtree of said multiple level XOR subtree coupled to a higher level XOR subtree of said multiple level XOR subtree through an intervening latch level;
a remainder XOR subtree having inputs and outputs;
a combinational XOR subtree having inputs and outputs, the outputs of said remainder XOR subtree and the outputs of said multiple level XOR subtree coupled to the inputs of said combinational XOR subtree; and
an M-bit current CRC result latch having inputs and outputs, the output of said combinational XOR subtree coupled to the inputs of said current CRC result latch and the outputs of said M-bit current CRC result latch coupled to the inputs of said remainder XOR subtree.

2. The circuit of claim 1, wherein said packet data slice latch, all latches in said intervening latch levels and said current CRC remainder latch are responsive to the same clock signal.

3. The circuit of claim 1, wherein
the number of the number of levels of said multiple level XOR subtree is a function of A, the maximum number of input bits to said multiple level XOR subtree to give a single output bit of said multiple level XOR subtree and of B, the maximum number of input bits to said remainder XOR subtree to give a single output bit of said remainder XOR subtree.

4. The circuit of claim 3, wherein the number of the number of levels of said multiple level XOR subtree is the log to the base B of A.

5. The circuit of claim 1, wherein K, the maximum number of XOR stages comprised of Z-input XOR gates in said remainder XOR subtree is the smallest whole positive number greater than the log to the base Z of the largest number of bits I of a subset of the M-bits of said CRC result latch required to generate output bits of said remainder XOR subtree.

6. The circuit of claim 5, wherein the maximum number N of inputs to any XOR subtree in any level of said multiple level XOR subtree comprised of Z-input XOR gates is equal to K raised to the Z power.

7. The circuit of claim 6, wherein the number of levels of said multiple level XOR subtree (Y−1), is the smallest whole positive number greater than the log to the base N of the largest number of bits J of a subset of the W-bits of said packet data slice latch.

8. The circuit of claim 7, wherein W=2048, I=20, J=1059, Z=3, K=3 and N=27.

9. A method for cyclic redundancy check calculation, comprising:
providing a W-bit packet data slice latch having outputs;
providing a multiple level XOR subtree having inputs and outputs, each level comprising one or more XOR subtrees, each output of said packet data slice latch coupled to an input of said multiple level XOR subtree, each lower level XOR subtree of said multiple level XOR subtree coupled to a higher level XOR subtree of said multiple level XOR subtree through an intervening latch level;
providing a remainder XOR subtree having inputs and outputs;
providing a combinational XOR subtree having inputs and outputs, the outputs of said remainder XOR subtree and the outputs of said multiple level XOR subtree coupled to the inputs of said combinational XOR subtree; and
providing an M-bit current CRC result latch having inputs and outputs, the output of said combinational XOR subtree coupled to the inputs of said current CRC result latch and the outputs of said M-bit current CRC result latch coupled to the inputs of said remainder XOR subtree.

10. The method of claim 9, wherein said packet data slice latch, all latches in said intervening latch levels and said current CRC remainder latch are responsive to the same clock signal.

11. The method of claim 9, wherein the number of the number of levels of said multiple level XOR subtree is a function of A, the maximum number of input bits to said multiple level XOR subtree to give a single output bit of said multiple level XOR subtree and of B, the maximum number of input bits to said remainder XOR subtree to give a single output bit of said remainder XOR subtree.

12. The method of claim 11, wherein the number of the number of levels of said multiple level XOR subtree is the log to the base B of A.

13. The method of claim 9, wherein K, the maximum number of XOR stages comprised of Z-input XOR gates in said remainder XOR subtree is the smallest whole positive number greater than the log to the base Z of the largest number of bits I of a subset of the M-bits of said CRC result latch required to generate output bits of said remainder XOR subtree.

14. The method of claim 13, wherein the maximum number of inputs N to any XOR subtree in any level of said multiple level XOR subtree comprised of Z-input XOR gates is equal to K raised to the Z power.

15. The method of claim 14, wherein the number of levels of said multiple level XOR subtree (Y−1), is the smallest whole positive number greater than the log to the base N of the largest number of bits J of a subset of the W-bits of said packet data slice latch.

16. The method of claim 15, wherein W=2048, I=20, J=1059, Z=3, K=3 and N=27.

17. A method of designing an M-bit cyclic redundancy check circuit, the method comprising:
partitioning an XOR function of said cyclic redundancy check circuit into a remainder XOR partition and a multiple level packet data slice XOR partition;

determining I, the largest number of bits I of a subset of the M-bits of a CRC result required to generate output bits of a remainder partition XOR subtree of said cyclic redundancy check circuit;

determining Z, the largest number of inputs to an XOR gate in a design library to be used in said cyclic redundancy check circuit;

calculating K, the maximum number of XOR stages comprised of Z-input XOR gates in said remainder XOR subtree;

calculating N, the maximum number of inputs to any XOR subtree in any level of a multiple level XOR subtree partition of said cyclic redundancy check circuit;

partitioning said multiple level XOR subtree partition into XOR subtrees having no number of inputs that is larger than a number of inputs to said remainder XOR subtree; and inserting a latch between each XOR subtree of a lower level partition of said packet data slice XOR partition and an immediately higher level partition of said packet data slice XOR partition.

18. The method of claim 17, wherein K is the smallest whole positive number greater than the log to the base Z of I.

19. The method of claim 18, wherein N, is equal to K raised to the Z power.

20. The method of claim 19, wherein the number of levels of said packet data slice XOR partition (Y−1), is the smallest whole positive number greater than the log to the base N of the largest number of bits J of a subset of the W-bits of said packet data slice latch.

* * * * *